United States Patent [19]
Runaldue

[11] Patent Number: 5,332,932
[45] Date of Patent: Jul. 26, 1994

[54] OUTPUT DRIVER CIRCUIT HAVING REDUCED VSS/VDD VOLTAGE FLUCTUATIONS

[75] Inventor: Thomas J. Runaldue, San Jose, Calif.

[73] Assignee: Advanced Micro Devices, Inc., Sunnyvale, Calif.

[21] Appl. No.: 760,310

[22] Filed: Sep. 16, 1991

[51] Int. Cl.$^5$ .................. H03K 17/16; H03K 19/0948
[52] U.S. Cl. ...................................... 307/443; 307/451; 307/475
[58] Field of Search ............... 307/443, 451, 452, 475, 307/480, 481, 594, 303.2

[56] References Cited

U.S. PATENT DOCUMENTS 4,731,553  3/1988  Van Lehn et al. .................. 307/451
4,928,023  5/1990  Marshall .............................. 307/443

OTHER PUBLICATIONS

Chen, John Y.; "CMOS Devices and Technology for VLSI"; ©1990 by Prentice Hall; Englewood Ciffs, N.J.; pp. 104–105.

Primary Examiner—Edward P. Westin
Assistant Examiner—Benjamin D. Driscoll
Attorney, Agent, or Firm—Davis Chin

[57] ABSTRACT

An output buffer driver circuit which significantly reduces the effects of voltage fluctuations in the upper and lower power supply potentials on an output signal includes a first pull-up circuit (44), a second pull-up circuit (46), a first pull-down circuit (48), a second pull-down circuit (50), a delay circuit (52), and control circuit (54). The first pull-up circuit (44) is coupled between a noisy upper power supply potential (VDDN) and output terminal (43). The second pull-up circuit (46) is coupled between a quiet upper power supply potential (VDDQ) and the output terminal. The first pull-down circuit (48) is coupled between noisy lower power supply potential (VSSN) and the output terminal. The second pull-down circuit (50) is coupled between a quiet lower power supply potential (VSSQ) and the output terminal. The second pull-up circuit (46) is delayed in its turn-on until the first pull-up circuit (44) is being turned-off when the output terminal is making the low-to-high transition so as to isolate the noisy upper power supply potential from the output terminal. Similarly, the second pull-down circuit (50) is delayed in its turn-on until the first pull-down circuit (48) is being turned-off when the output terminal is making the high-to-low transition so as to isolate the noisy lower power supply potential from the output terminal.

12 Claims, 3 Drawing Sheets

OUTPUT DRIVER CIRCUIT HAVING REDUCED VSS/VDD VOLTAGE FLUCTUATIONS

BACKGROUND OF THE INVENTION

This invention relates generally to output buffer circuits and more particularly, it relates to an improved CMOS output buffer driver circuit which significantly reduces the effects of VSS/VDD voltage fluctuations on the output signal lines but yet maintains a high-speed of operation.

As is well-known in the art, digital logic circuits are widely used in the areas of electronics and computer-type equipment. Specifically, one such use of digital logic circuits is to provide an interface function between one logic type of a first integrated circuit device and another logic type of a second integrated circuit device. An output buffer circuit is an important component for this interface function. The output buffer circuit provides, when enabled, an output signal which is a function of a data input signal received from other logic circuitry of the integrated circuit.

In FIG. 1, there is shown a simplified schematic circuit diagram of a conventional output buffer driver circuit 10 which is formed as a part of a semiconductor integrated circuit chip 12. The output buffer driver circuit 10 includes a pull-up transistor device 14 and a pull-down transistor device 16 connected in series between respective first and second power supply terminal pins 18, 20. The first power supply pin 18 may be supplied with a positive potential or voltage VDD (typically at +5.0 volts) which is connected to an internal power supply potential node VL2 via a lead line having parasitic inductance L2. The source of the P-channel field-effect transistor 14 is also connected to the node VL2. The parasitic inductance L2 represents a package inductance associated with the terminal pin 18 itself and the bond wire used to connect the source of the transistor 14 to the terminal pin 18. The second power supply terminal pin 20 may be supplied with a ground potential VSS (typically at 0 volts) which is connected to an internal ground potential node VL1 via a lead line having parasitic inductance L1. The source of the N-channel field-effect transistor 16 is also connected to the node VL1. The parasitic inductance L1 represents a package inductance associated with the terminal pin 20 itself and the bond wire used to connect the source of the transistor 16 to the terminal pin 20.

The drains of the transistors 14 and 16 are connected together and are further joined to an internal node 22. The internal node 22 is also connected to an output terminal pin 24 via a lead connection having parasitic inductance L3. The parasitic inductance L3 represents a package inductance associated with the output terminal pin 24 itself and the bond wire used to connect the drains of the transistors 14, 16 to the terminal pin 24. The output of the terminal pin 24 of the buffer driver circuit 10 is used to drive a capacitive load represented by capacitor CAP and connected between the terminal pin 24 and the ground potential VSS. The capacitor CAP defines the load that the output terminal pin sees and is the sum individual capacitances of all the devices being driven as well as the board capacitance.

A control circuitry 26 has a first input on line 28 for receiving a data input signal DATAIN and a second input on line 30 for receiving an enable signal ENABLE. The control circuitry 26 has a first control signal ENUP on line 32 connected to the gate of the P-channel pull-up transistor 14 and a second control signal ENDOWN on line 34 connected to the gate of the N-channel pull-down transistor 16.

Dependent upon the logic state of the data input signal and the enable signal, either the pull-up transistor 14 or the pull-down transistor 16 is quickly turned off and the other one of them is turned on. Such rapid switching off and on of the pull-up and pull-down transistor devices causes sudden surges of current creating what is commonly known as current spikes. As a result, when the internal output node 22 is making a high-to-low transition, oscillation or inductive ringing appears at the output terminal 24 referred to as "ground bounce." This "ground bounce" is defined to be undershooting of the ground potential followed by a dampening oscillation around it.

Also, during such output switching charging and discharging currents from the pull-up and pull-down transistor devices will flow through the package inductances of the power supply and ground lines so as to cause inductive noise at the internal power supply potential node VL2 and at the internal ground potential node VL1. These internal supply and ground noises or ringing results in an undershoot/overshoot phenomenon which is undesirable since it will degrade the output voltage levels (logic "1" and logic "0") causing interface problems among the output buffer driver circuit and other integrated circuits. Further, this ringing phenomenon will delay the stable logic level transition time of the output signal line which the output buffer driver circuit is attempting to drive.

Accordingly, it would be desirable to provide an improved CMOS output buffer driver circuit which is immune to ground bounce noise but yet has a high switching speed. The output buffer driver circuit of the present invention represents an improvement over the output buffer circuit 10 of FIG. 1 and includes a pair of noisy upper and lower power supply potential lines and a pair of quiet upper and lower power supply potential lines so as to reduce the noise that may be transferred between the output signal lines and the quiet upper and lower power supply potential lines.

SUMMARY OF THE INVENTION

Accordingly, it is a general object of the present invention to provide an improved CMOS output buffer driver circuit which is relatively simple and economical to manufacture and assemble, but yet overcomes the disadvantages of the prior art output buffer circuits.

It is an object of the present invention to provide an improved CMOS output buffer driver circuit which significantly reduces the effects of voltage fluctuations in the noisy upper and lower power supply potentials on an output signal line but yet maintains a high-speed of operation.

It is another object of the present invention to provide a CMOS output buffer driver circuit which includes a pair of noisy upper and lower power supply potential lines and a pair of quiet upper and lower power supply potential lines so as to reduce the noise that may be transferred between the output signal line and the quiet upper and lower power supply potential lines.

It is still another object of the present invention to provide a CMOS output buffer driver circuit which includes a first pull-up circuit, a second pull-up circuit, a first pull-down circuit, a second pull-down circuit, a delay circuit, and control circuitry.

In accordance with these aims and objectives, the present invention is concerned with the provision of an output buffer driver circuit which significantly reduces the effects of voltage fluctuations in the noisy upper and lower power supply potentials on an output signal. The output buffer driver circuit includes a first pull-up circuit, a second pull-up circuit, a first pull-down circuit, a second pull-down circuit, a delay circuit, and a control circuit. The first pull-up circuit is responsive to a first control signal for generating quickly a low-to-high transition of the output signal at an output terminal. The first pull-up circuit is coupled between a noisy upper power supply potential and the output terminal. The second pull-up circuit is responsive to a second control signal for maintaining the output signal at a high logic level after the low-to-high transition has been completed. The second pull-up circuit is coupled between a quiet upper power supply potential and the output terminal.

The first pull-down circuit is responsive to a third control signal for generating quickly a high-to-low transition of the output signal at the output terminal. The first pull-down circuit is coupled between a noisy lower power supply potential and the output terminal. The second pull-down circuit is responsive to a fourth control signal for maintaining the output signal at a low logic level after the high-to-low transition has been completed. The second pull-down circuit is coupled between a quiet lower power supply potential and the output terminal.

The delay circuit is responsive to the logic level of the output signal for generating a first delayed logic signal and a second delayed logic signal. The control circuit is responsive to a data input logic signal, the first delayed logic signal, and the second delayed logic signal for generating the first through fourth control signals. The output signal on the output terminal is isolated from the noisy upper and lower power supply potential during the low-to-high and high-to-low transitions

BRIEF DESCRIPTION OF THE DRAWINGS.

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
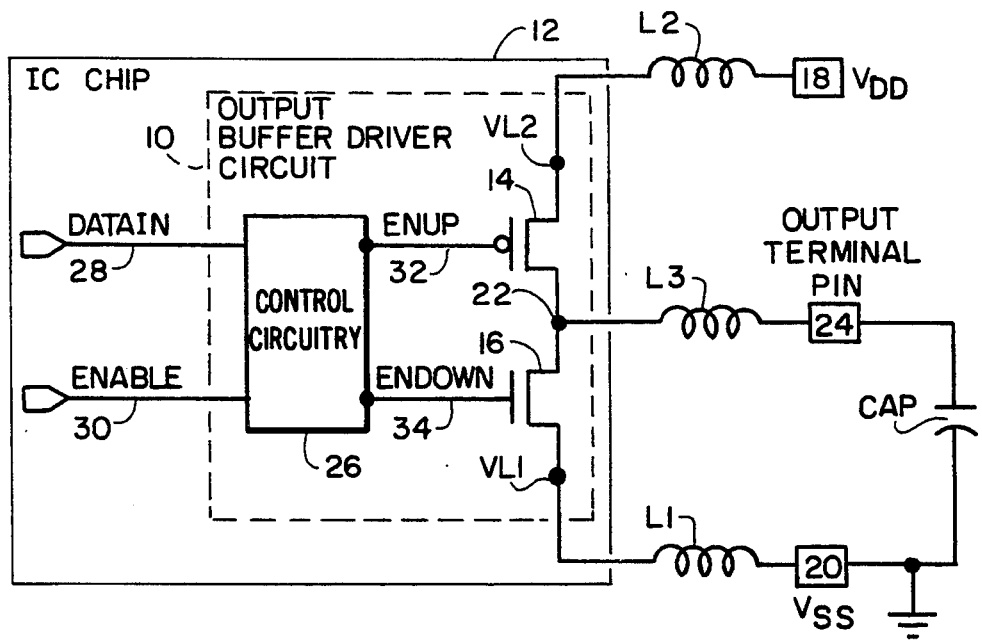
FIG. 1 is a simplified schematic circuit diagram of a conventional output buffer driver circuit.
Figure 2:
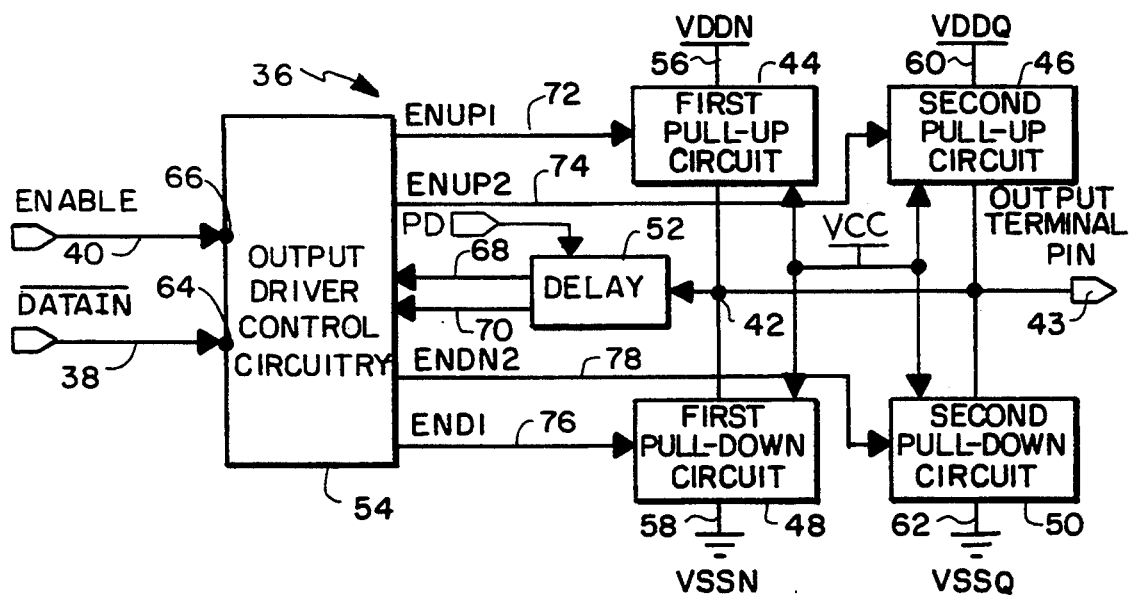
FIG. 2 is a block diagram of an improved CMOS output buffer driver circuit constructed in accordance with the principles of the present invention.

Referring now in detail to the drawings, there is shown in FIG. 2 a block diagram of an improved CMOS output buffer driver circuit 36 constructed in accordance with the principles of the present invention. The output buffer driver circuit 36 significantly reduces the effects of VSS/VDD voltage fluctuations on the output signal lines but yet maintains a high-speed of operation. The output buffer driver circuit has a first input on line 38 for receiving a data input signal $\overline{\text{DATAIN}}$ and a second input on line 40 for receiving an enable signal ENABLE. The output buffer driver circuit provides an output signal at an output node 42 in response to the data input signal. The output node 42 is connected to an output terminal pin 43 which is used to drive the capacitive load (not shown).

The output buffer driver circuit 36 includes a first pull-up circuit 44, a second pull-up circuit 46, a first pull-down circuit 48, a second pull-down circuit 50, a delay circuit 52, and control circuitry 54. The output buffer driver circuit further includes a first pair of noisy internal power supply and ground potential lines 56, 58 and a second pair of quiet internal power supply and ground potential lines 60, 62. The noisy power supply potential line 56 is connected to a noisy upper power supply potential VDDN, and the noisy ground potential 58 is connected to the noisy lower power supply or ground potential VSSN. The quiet power supply potential line 60 is connected to a quiet upper power supply potential VDDQ, and the quiet ground potential line 62 is connected to a quiet lower power supply or ground potential VSSQ.

The first pull-up circuit 44 is coupled between the noisy upper power supply potential VDDN and the output terminal pin 43. The first pull-down circuit 48 is coupled between the output terminal pin 43 and the noisy ground potential VSSN. The second pull-up circuit 46 is coupled between the quiet power supply potential VDDQ and the output terminal pin 43. The second pull-down circuit 50 is coupled between the output terminal 43 and the quiet ground potential VSSQ. The control circuitry 54 has a first input node 64 coupled to receive the data input signal $\overline{\text{DATAIN}}$ and a second input node 66 for receiving the enable signal ENABLE. The delay circuit 52 has its input connected to the output node 42 and its outputs on lines 68, 70 fed to the input of the control circuitry 54.

The control circuitry 54 generates a first control signal ENUP1 on line 72 which is used to control the first pull-up circuit 44 and a second control signal ENUP2 on line 74 which is used to control the second pull-up circuit 46. The control circuitry 54 further generates a third control signal ENDN1 on line 76 which is used to control the first pull-down circuit 48 and a fourth control signal ENDN2 on line 78 which is used to control the second pull-down circuit 50.

Figure 3:
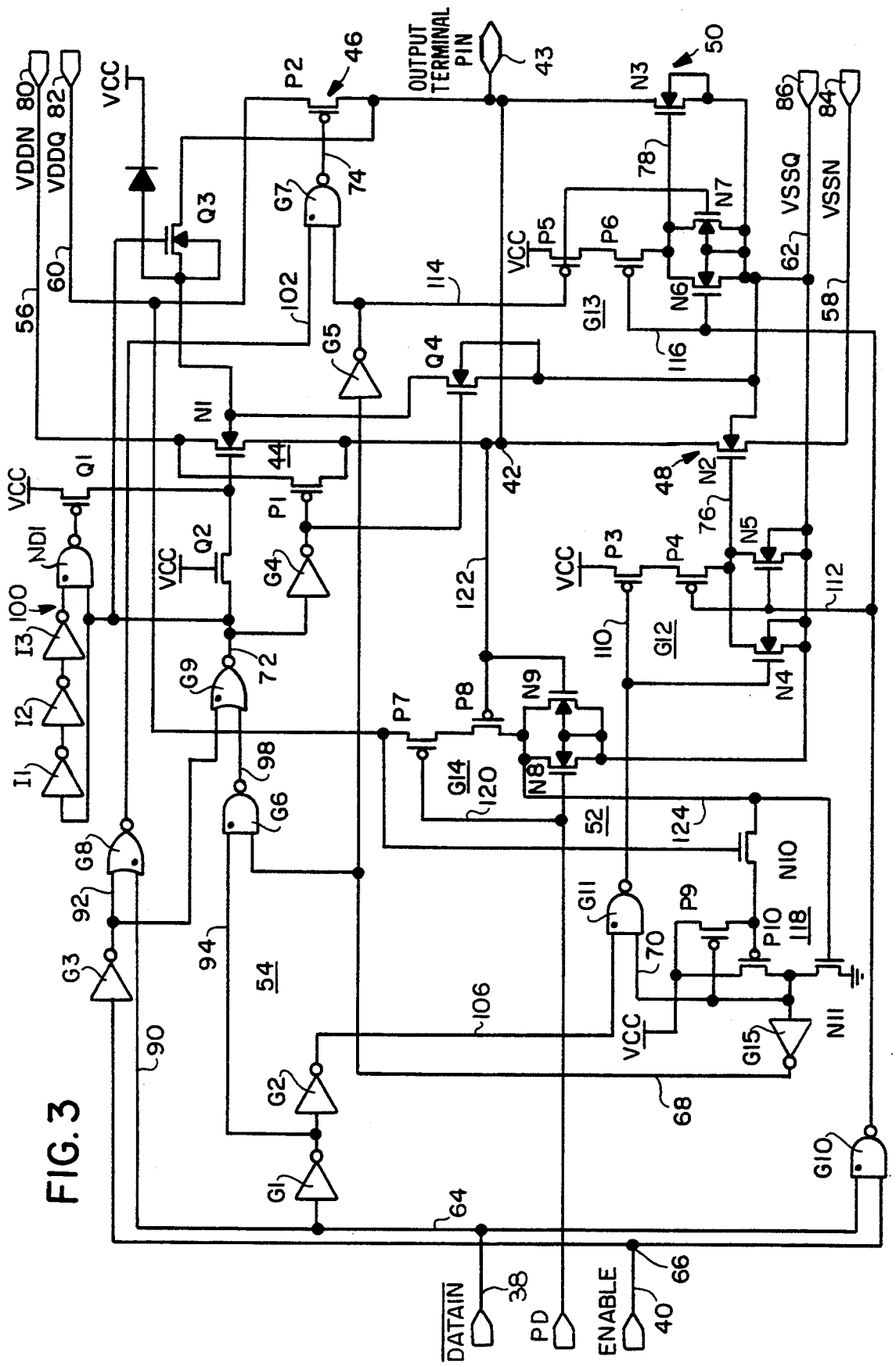
FIG. 3 is a detailed schematic circuit diagram of the output buffer driver circuit of FIG. 2.

In FIG. 3, there is shown a detailed schematic circuit diagram of the output driver circuit 36 of the present invention. The first pull-up circuit 44 includes a P-channel MOS pull-up transistor P1 and an N-channel MOS pull-up transistor N1. The transistor P1 has its source connected to the drain of the transistor N1 and to the noisy upper power supply potential VDDN via line 56 and terminal 80. The transistor P1 has its drain connected to the source of the transistor N1 and to the output terminal pin 43 via the output node 42. The second pull-up circuit 46 includes a P-channel MOS pull-up transistor P2 having its source connected to the quiet upper power supply potential VDDQ via the line 60 and terminal 82 and its drain connected to the output terminal pin 43. The transistors P1 and N1 are designed to be relatively large in size so as to produce a high speed of operation during switching. The transistor P2 is made to be relatively smaller in size than the transistors P1 and N1 so as to provide a low current drive.

The first pull-down circuit 48 includes a N-channel MOS pull-down transistor N2 having its drain connected to the output terminal pin 43 via the output node 42 and its source connected to the noisy ground potential VSSN via the line 58 and terminal 84. The second pull-down circuit 50 includes an N-channel MOS pull-down transistor N3 having its drain connected to the output terminal pin 43 and its source connected to the quiet ground potential VSSQ via the line 62 and terminal 86. The transistor N2 is made to be relatively large in size so as to produce a high speed of operation during switching. The transistor N3 is made to be relatively smaller in size than the transistor N2 so as to provide a low current drive.

The control circuitry 54 includes inverters G1–G5; NAND logic gates G6, G7; and NOR logic gates G8, G9. The NOR gate G8 receives the data input signal DATAIN on line 90 and the enable signal ENABLE on line 92 via the inverter G3. The NAND gate G6 receives the same data input signal DATAIN on line 94 via the inverter G1 and the first output on the line 68 of the delay circuit 52. The NOR gate G9 receives also the enable signal ENABLE via the inverter G3 and the output of the NAND gate G6 on line 98. The output of the NOR gate G9 on the line 72 defining the first control signal ENUP1 is connected to the gate of the pull-up transistor N1 via a boosting circuit 100. The first control signal ENUP1 is also connected to the gate of the pull-up transistor P1 via the inverter G4.

The boosting circuit 100 is comprised of inverters I1–I3; a NAND logic gate ND1; P-channel MOS transistor Q1; and an N-channel pass transistor Q2. The boosting circuit serves to pull the source of the pull-up transistor N1 close to the noisy upper power supply potential VDDN. A detailed operation of this boosting circuit is described in co-pending application Ser. No. 760,414 filed on Sep. 16, 1991 and entitled "CMOS SELF-BOOST CIRCUIT," which is assigned to the same assignee as the present invention. The NAND gate G7 has a first input connected to the output of the NOR gate G8 on line 102 and a second input connected also to the first output of the delay circuit 52 on the line 68 via the inverter G5. The output of the NAND gate G7 on the line 74 defining the second control signal ENUP2 is connected to the gate of the pull-up transistor P2. The N-channel pass transistor Q3 and the discharging transistor Q4 serve to reduce the body-effect threshold between the substrate and the source of the pull-up transistor N1. The detailed operation of the transistors Q3 and Q4 is described in co-pending application Ser. No. 760,313 filed on Sep. 16, 1991 entitled "N-CHANNEL PULLUP TRANSISTOR WITH REDUCED BODY EFFECT," which is assigned to the same assignee as the present invention.

The control circuitry 54 further includes NAND logic gates G10, G11 and NOR logic gates G12, G13. The NOR gate G12 is comprised of transistors P3, P4, N4 and N5, and the NOR gate G13 is comprised of transistors P5, P6, N6, and N7. The NAND gate G10 receives also the data input signal DATAIN on the line 38 and the enable signal ENABLE on the line 40. The NAND gate G11 receives the same data input signal DATAIN on line 106 via the inverters G1 and G2 and the second output of the delay circuit 52 on the line 70. The NOR gate G12 has its first input on line 110 connected to the output of the NAND gate G11 and its second input on line 112 connected to the output of the NAND gate G10. The output of the NOR gate G12 on the line 76 defining the third control signal ENDN1 is connected to the gate of the pull-down transistor N2. The NOR gate G13 has its first input on line 114 connected to the first output of the delay circuit via the inverter G5 and its second input on line 116 connected to the output of the NAND gate G10. The output of the NOR gate G13 on the line 78 defining the fourth control signal ENDN2 is connected to the gate of the pull-down transistor N3.

The delay circuit 52 serves to sense the output signal on the output terminal 43 at mid-logic level and adds some finite delay to time the crossover transition from the noisy upper and lower power supply potentials to the quiet upper and lower power supply potentials. The delay circuit includes a NOR logic gate G14 and a translator circuit portion 118. The NOR gate G14 is comprised of transistors P7, P8, N8 and N9. The NOR gate G14 has its first input on line 120 connected to a power-down signal PD and its second input on line 122 coupled to the output terminal pin 43 via the output node 42. In normal operation, the power-down signal PD is at a low logic level. When the power-down signal PD is at a high logic level, this produces a power-down mode at the output terminal pin 43 so as to conserve power. The output of the NOR gate G14 on line 124 is fed to the input of the translator circuit portion 118. The translator circuit portion is formed of transistors P9, P10, N10, N11 and an inverter G15. The translator circuit portion is used to level-shift the voltage logic levels of 0–3.3 volts on the line 124 to 0–5 volts on the line 70 to produce the second delayed signal. The first delayed signal on the line 68 is inverted from the signal on the line 70.

In order to provide an understanding of the operation of the present invention, the pull-up action of FIG. 3 will now be explained with reference to the waveforms of FIGS. 4(a)–4(g). Initially, it is assumed that at time t$\phi$ enable signal ENABLE is high, the data input signal DATAIN is low, and the output signal on the output terminal pin 43 is low. These signals are shown in corresponding FIGS. 4(a), 4(b), and 4(g). Further, it will be assumed that the first and third control signals ENUP1 and ENDN1 are low and that the second and fourth control signals ENUP2 and ENDN2 are high. These signals are illustrated in respective FIGS. 4(c) through 4(f). Thus, the output terminal pin 43 will be connected to the quiet ground potential VSSQ.

Figure 4:
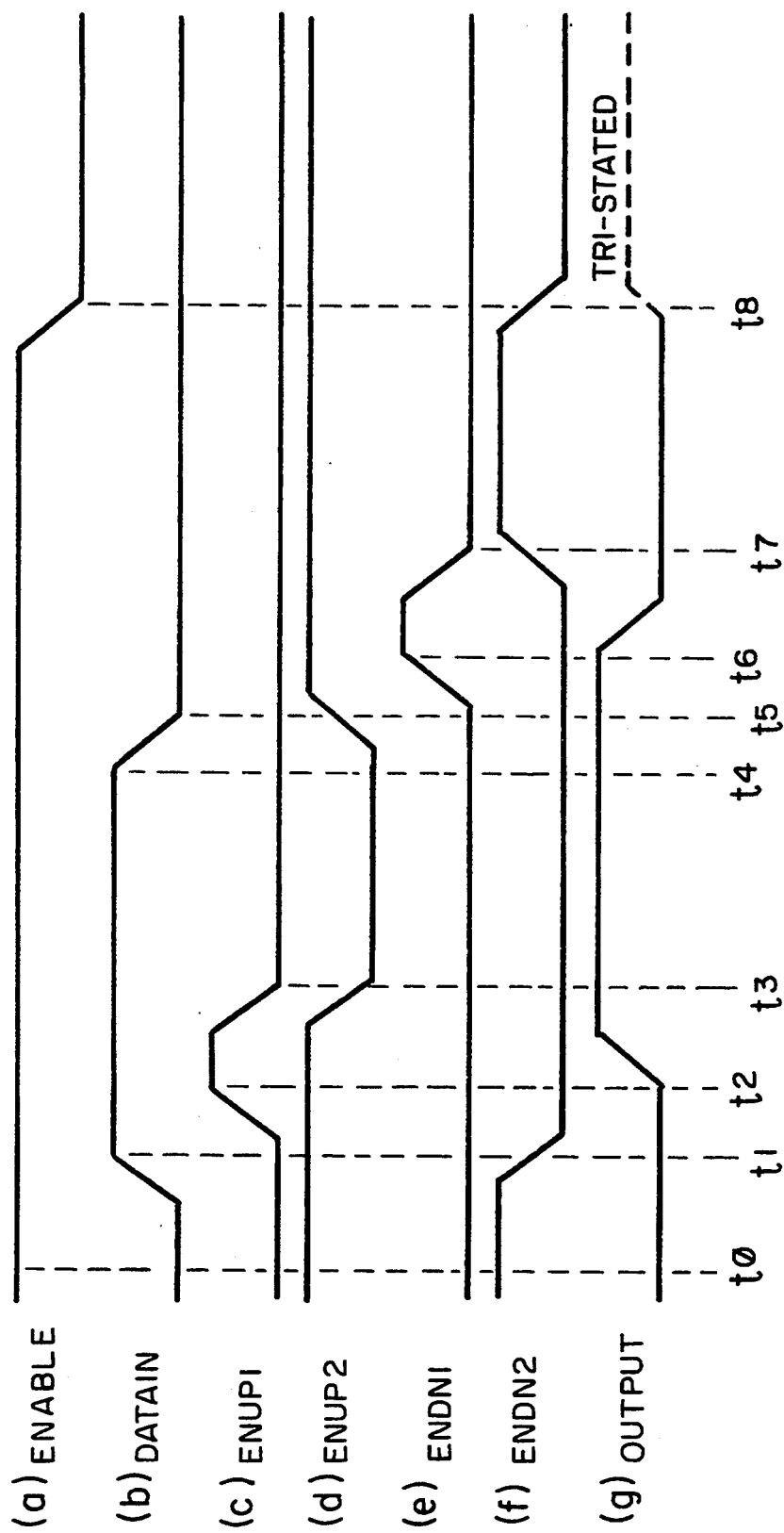
FIGS. 4(a)–4(g) are waveforms at various points in the circuit of FIG. 3 useful in understanding the operation thereof.

When the data input signal DATAIN (FIG. 4(b)) makes a low-to-high transition at time t1, the output of the NAND gate G10 will immediately go high causing the output of the NOR gate G13 defining the fourth control signal ENDN2 (FIG. 4(f)) to go low. As a result, the pull-down transistor N3 is turned off quickly. A short time later, at time t2, the output of the NOR gate G9 defining the first control signal ENUP1 will go high so as to turn on the transistors N1, P1. The output signal (FIG. 4(g)) on the output terminal 43 is now connected to the noisy upper power supply potential VDDN and will begin to make a low-to-high transition. This output signal is sensed by the delay circuit 52 so as to provide a low on the line 124 indicating to the control circuitry 54 that the low-to-high transition has taken place. The first delayed signal on the line 68 will go low so as to cause the output of the NAND gate G6 to go high, which, in turn, causes the output of the NOR gate G9 to go low. This corresponds to the first control signal ENUP1 which is shown at time t3. Therefore, the transistors N1 and P1 will be turned off.

Simultaneously, at the time t3 the output of the NAND gate G7 will go low corresponding to the second control signal ENUP2, which is shown in FIG. 4(d). Consequently, the pull-up transistor P2 will be turned on. It can be seen that this sequence serves to transfer the output terminal pin 43 (which may have a number of other circuit devices connected thereto) from the noisy upper power supply potential VDDN to the quiet upper power supply potential VDDQ. Thus, the noise generated in the noisy power supply line 56 has been isolated from the output terminal pin 43 so as to prevent the noisy power supply line from affecting other circuit devices connected to the same output terminal pin.

The pull-down action of FIG. 3 will now be explained. It will be noted that at the time t4 the data input signal DATAIN is at the high level and that the output signal at the output terminal pin 43 is high. Further, the pull-up transistor P2 is turned on since the second control signal ENUP2 is low, and the transistors N1, P1, N2 and N3 are all turned off since the first, third and fourth control signals are low at this time t4.

When the data input signal DATAIN makes a high-to-low transition at time t5, the output of the NOR gate G8 will immediately go low causing the output of the NAND gate G7 defining the second control signal ENUP2 to go high. As a result, the pull-up transistor P2 is turned off. A short time later at time t6, the output of the NOR gate G12 defining the third control signal ENDN1 will go high so as to turn on the transistor N2. The output signal on the output terminal 43 is now connected to the noisy ground potential VSSN and will begin to make a high-to-low transition. This output signal is again sensed by the delay circuit 52 so as to provide a high on the line 124 indicating to the control circuitry 54 that the high-to-low transition has taken place. The second delayed signal on the line 70 will go low so as to cause the output of the NAND gate G11 to go high which, in turn, causes the output of the NOR gate G12 to go low. This corresponds to the third control signal ENDN1 which is low at the time t7. Therefore, the pull-down transistor N2 will be turned off.

Simultaneously, at the time t7 the output of the NOR gate G13 will go high corresponding to the fourth control signal ENDN2 which is shown in FIG. 4(f). Consequently, the transistor N3 will be turned on. It can be seen that this sequence serves to transfer the output terminal pin 43 from the noisy lower power supply potential VSSN to the quiet lower power supply potential VSSQ. Thus, the noise generated in the noisy power supply line 58 has been isolated from the output terminal 43 so as to prevent it from affecting other circuit devices connected to the same output terminal pin.

When the enable signal ENABLE is at the low or logic "0" level at time t8, the output of the NOR gate G9 will be low and the output of the NAND gate G7 will be high, causing the pull-up transistors P1, N1 and P2 to be turned off. Further, the outputs of the NOR gates G12 and G13 will be low, causing both pull-down transistors N2 and N3 to be turned off. This produces a high tri-state mode at the output terminal pin 43 in which the output buffer driver circuit is disabled. The output signal in the tri-stated condition is isolated from all noisy and quiet VDD/VSS power supply and is shown in dotted lines in FIG. 4(g).

As can be seen, the pull-up transistor P2 is delayed in its turn-on until the pull-up transistors P1, N1 are being turned-off when the output terminal is making the low-to-high transition so as to isolate the noisy upper power supply potential VDDN from the output terminal pin. Similarly, the pull-down transistor N3 is delayed in its turn-on until the pull-down transistor N2 is being turned-off when the output terminal is making a high-to-low transition so as to isolate the noisy lower power supply potential VSSN from the output terminal pin. As a consequence, the effects of the voltage fluctuations in the noisy upper and lower power supply potentials (VDDN and VSSN) on the output signal at the output terminal pin (43) are significantly reduced.

From the foregoing detailed description, it can thus be seen that the present invention provides an improved CMOS output buffer driver circuit which includes a first pull-up circuit, a second pull-up circuit, a first pull-down circuit, a second pull-down circuit, a delay circuit, and control circuitry. The output buffer driver circuit of the present invention significantly reduces the effects of voltage fluctuations in the noisy upper and lower power supply potentials on the output signal but yet maintains a high-speed of operation.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An output buffer driver circuit which significantly reduces the effects of voltage fluctuations in the upper and lower power supply potentials on an output signal, comprising:

first pull-up circuit means (44) responsive to a first control signal for generating quickly a low-to-high transition of the output signal at an output terminal (43);

said first pull-up circuit means being coupled to a noisy upper power supply potential (VDDN) and the output terminal (43);

second pull-up circuit means (46) responsive to a second control signal for maintaining the output signal at a high logic level after the low-to-high transition has been completed;

said second pull-up circuit means being coupled to a quiet upper power supply potential (VDDQ) and the output terminal;

first pull-down circuit means (48) responsive to a third control signal for generating quickly a high-to-low transition of the output signal at the output terminal (43);

said first pull-down circuit means being coupled between a noisy lower power supply potential (VSSN) and the output terminal (43);

second pull-down circuit means (50) responsive to a fourth control signal for maintaining the output signal at a low logic level after the high-to-low transition has been completed;

said second pull-down circuit means being coupled to a quiet lower power supply potential (VSSQ) and the output terminal;

delay circuit means (52) responsive to the logic level of the output signal for generating a first delayed logic signal and a second delayed logic signal; and control circuit means (54) responsive to a data input logic signal, said first delayed logic signal, and said second delayed logic signal for generating said first through fourth control signals, whereby the output signal at the output terminal is connected to the noisy upper power supply potential during the low-to-high transition and is connected to the noisy lower supply potential during the high-to-low transition.

2. An output buffer driver circuit as claimed in claim 1, wherein said first pull-up circuit means (44) comprises a first pull-up transistor and a second pull-up transistor connected in parallel with said first pull-up transistor, said first and second pull-up transistors having their conduction path electrodes connected between the noisy upper power supply potential and the output terminal and their gates coupled to said first control signal.

3. An output buffer driver circuit as claimed in claim 2, wherein said first pull-up transistor is a P-channel MOS transistor (P1).

4. An output buffer driver circuit as claimed in claim 3, wherein said second pull-up transistor is an N-channel MOS transistor (N1).

5. An output buffer driver circuit as claimed in claim 4, wherein said second pull-up circuit means (46) comprises a third pull-up transistor having its conduction path electrodes connected between the quiet upper power supply potential and the output terminal and its gate connected to said second control signal.

6. An output buffer driver circuit as claimed in claim 5, wherein said third pull-up transistor is a P-channel MOS transistor (P2).

7. An output buffer driver circuit as claimed in claim 6, wherein said first pull-down circuit means (48) comprises a first pull-down transistor having its conduction path electrodes connected between the noisy lower power supply potential and the output terminal and its gate connected to said third control signal.

8. An output buffer driver circuit as claimed in claim 7, wherein said first pull-down transistor is an N-channel MOS transistor (N2).

9. An output buffer driver circuit as claimed in claim 8, wherein said second pull-down circuit means (50) comprises a second pull-down transistor having its conduction path electrodes connected between the quiet lower power supply potential and the output terminal and its gate connected to said fourth control signal.

10. An output buffer driver circuit as claimed in claim 9, wherein said second pull-down transistor is an N-channel MOS transistor (N3).

11. An output buffer driver circuit as claimed in claim 6, wherein said third pull-up transistor (P2) is delayed in its turn-on until said first and second pull-up transistors (P1, N1) are being turned-off when the output terminal is making the low-to-high transition so as to isolate the noisy upper power supply potential from the output terminal.

12. An output buffer driver circuit as claimed in claim 10, wherein said second pull-down transistor (N3) is delayed in its turn-on until said first pull-down transistor (N2) is being turned-off when the output terminal is making the high-to-low transition so as to isolate the noisy lower power supply potential from the output terminal.

* * * * *